(12) United States Patent
Sasao et al.

(10) Patent No.: US 11,192,971 B2
(45) Date of Patent: Dec. 7, 2021

(54) PATTERN FORMING MATERIAL, COMPOSITION FOR PATTERN FORMATION, PATTERN FORMING METHOD AND METHOD OF MANUFACTURING SEMICONDUCTOR DEVICE

(71) Applicant: TOSHIBA MEMORY CORPORATION, Tokyo (JP)

(72) Inventors: Norikatsu Sasao, Kawasaki Kanagawa (JP); Koji Asakawa, Kawasaki Kanagawa (JP); Shinobu Sugimura, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 21 days.

(21) Appl. No.: 16/562,744

(22) Filed: Sep. 6, 2019

(65) Prior Publication Data

US 2020/0291155 A1 Sep. 17, 2020

(30) Foreign Application Priority Data

Mar. 11, 2019 (JP) .............................. JP2019-044105
Aug. 28, 2019 (JP) .............................. JP2019-155576

(51) Int. Cl.
*C08F 220/14* (2006.01)
*C08F 220/16* (2006.01)
(Continued)

(52) U.S. Cl.
CPC ............ *C08F 220/14* (2013.01); *B29C 43/02* (2013.01); *C08F 218/04* (2013.01);
(Continued)

(58) Field of Classification Search
CPC ....... B29L 2031/3406; H01L 21/31058; H01L 21/0332; H01L 21/31144; H01L 21/0273;
(Continued)

(56) References Cited

U.S. PATENT DOCUMENTS 8,808,961 B2 8/2014 Tsuchimura et al.
9,310,683 B2 4/2016 Hatakeyama et al.
(Continued)

FOREIGN PATENT DOCUMENTS

JP 2001-310331 A 11/2001
JP 2009-294630 A 12/2009
(Continued)

OTHER PUBLICATIONS

Biswas et al., "New Insight into the Mechanism of Sequential Infiltration Synthesis from Infrared Spectroscopy," Chemistry of Materials, vol. 26 , pp. 6135-6141 (2014).

*Primary Examiner* — Caleen O Sullivan
(74) *Attorney, Agent, or Firm* — Finnegan, Henderson, Farabow, Garrett & Dunner, L.L.P.

(57) ABSTRACT

According to one embodiment, a pattern forming material is disclosed. The pattern forming material contains a polymer. The polymer includes a specific first monomer unit. The monomer unit has a structure having ester of a carboxyl group at a terminal of a side chain. In the ester, a carbon atom bonded to an oxygen atom next to a carbonyl group is a primary carbon, a secondary carbon or a tertiary carbon. The pattern forming material is used for manufacturing a composite film as a mask pattern for processing a target film on a substrate. The composite film is formed by a process including, forming an organic film on the target film with the pattern forming material, patterning the organic film, and forming the composite film by infiltering a metal compound into the patterned organic film.

23 Claims, 2 Drawing Sheets

(51) Int. Cl.

| | |
|---|---|
| *C08F 218/04* | (2006.01) |
| *G03F 7/038* | (2006.01) |
| *G03F 7/039* | (2006.01) |
| *G03F 7/00* | (2006.01) |
| *C09D 133/08* | (2006.01) |
| *C09D 133/10* | (2006.01) |
| *C09D 131/02* | (2006.01) |
| *B29C 43/02* | (2006.01) |
| *C23C 16/455* | (2006.01) |
| *C23C 16/20* | (2006.01) |
| *H01L 21/027* | (2006.01) |
| *H01L 21/311* | (2006.01) |
| *H01L 21/285* | (2006.01) |
| *H01L 21/3213* | (2006.01) |
| *B29K 33/00* | (2006.01) |
| *G03F 7/16* | (2006.01) |
| *G03F 7/20* | (2006.01) |
| *B29L 31/34* | (2006.01) |

(52) U.S. Cl.
CPC .......... *C08F 220/16* (2013.01); *C09D 131/02* (2013.01); *C09D 133/08* (2013.01); *C09D 133/10* (2013.01); *C23C 16/20* (2013.01); *C23C 16/45553* (2013.01); *G03F 7/0002* (2013.01); *G03F 7/038* (2013.01); *G03F 7/039* (2013.01); *H01L 21/0273* (2013.01); *H01L 21/28556* (2013.01); *H01L 21/31138* (2013.01); *H01L 21/32135* (2013.01); *H01L 21/32139* (2013.01); *B29K 2033/08* (2013.01); *B29L 2031/3406* (2013.01); *G03F 7/162* (2013.01); *G03F 7/168* (2013.01); *G03F 7/20* (2013.01)

(58) Field of Classification Search
CPC ......... H01L 21/31138; H01L 21/28556; H01L 21/32139; H01L 21/32135; C09D 133/14; C09D 133/06; C09D 133/08; C09D 133/10; C09D 131/02; C08F 220/00; C08F 220/16; C08F 220/14; C08F 218/04; G03F 7/094; G03F 7/162; G03F 7/168; G03F 7/20; G03F 7/038; G03F 7/039; G03F 7/0002; C23C 16/20; C23C 16/45553; B29K 2033/08; B29C 43/02
USPC .................................. 430/311, 270.1, 271.1
See application file for complete search history.

(56) References Cited

U.S. PATENT DOCUMENTS

| | | | |
|---|---|---|---|
| 9,487,600 | B2 | 11/2016 | Darling et al. |
| 2013/0288180 | A1* | 10/2013 | Hatakeyama ......... C08F 220/38 430/285.1 |
| 2016/0365280 | A1 | 12/2016 | Brink et al. |
| 2018/0173109 | A1* | 6/2018 | Gronheid .............. G03F 7/0047 |
| 2018/0374695 | A1* | 12/2018 | Yamada ........... H01L 21/31144 |

FOREIGN PATENT DOCUMENTS

| | | |
|---|---|---|
| JP | 2011-93856 A | 5/2011 |
| JP | 2013-227433 A | 11/2013 |

\* cited by examiner

PATTERN FORMING MATERIAL, COMPOSITION FOR PATTERN FORMATION, PATTERN FORMING METHOD AND METHOD OF MANUFACTURING SEMICONDUCTOR DEVICE

CROSS-REFERENCE TO RELATED APPLICATIONS

This application is based upon and claims the benefit of priority from Japanese Patent Applications No. 2019-044105 filed on Mar. 11, 2019 and No. 2019-155576 filed on Aug. 28, 2019; the entire contents of all of which are incorporated herein by reference.

FIELD

Embodiments of the present invention relate to a pattern forming material, a composition for pattern formation, a pattern forming method and a method of manufacturing a semiconductor device.

BACKGROUND

In a manufacturing process of a semiconductor device, there is increasing demand for a technology forming a pattern with a high aspect ratio. High etch resistance is required for a mask pattern used for such a process because it is exposed to etching gas for a long time.

DETAILED DESCRIPTION

Figure 1A:
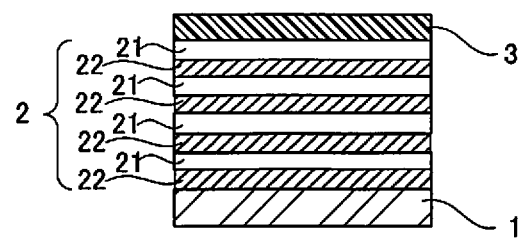
FIG. 1A is a view illustrating one process of a method of manufacturing a semiconductor device according to an embodiment.

According to one embodiment, a pattern forming material is disclosed. The pattern forming material contains a polymer. The polymer includes a first monomer unit represented by a following general formula (1). The pattern forming material is used for manufacturing a composite film as a mask pattern for processing a target film on a substrate. The composite film is formed by a process including, forming an organic film on the target film with the pattern forming material, patterning the organic film, and forming the composite film by infiltering a metal compound into the patterned organic film.

[Chemical formula 1]

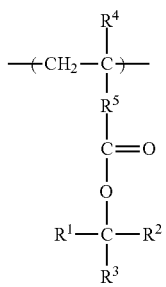

In the general formula (1), $R^1$, $R^2$ and $R^3$ each independently represent a hydrogen atom or a hydrocarbon group which may have an oxygen atom, at least one of $R^1$, $R^2$ and $R^3$ is a hydrocarbon group, a total number of carbon atoms of $R^1$, $R^2$ and $R^3$ is 1 to 13, and $R^1$, $R^2$ and $R^3$ may be bonded to each other to form a ring. $R^4$ is a hydrogen atom or a methyl group. $R^5$ is a single bond, or a hydrocarbon group which has 1 to 20 carbon atoms and may have an oxygen atom, a nitrogen atom, or a sulfur atom between carbon-carbon atoms or at a bond terminal, and a hydrogen atom thereof may be substituted by a halogen atom.

According to another embodiment, a composition for pattern formation contains the pattern forming material described above and a solvent.

According to another embodiment, a pattern forming method is disclosed. The pattern forming method includes forming an organic film on a substrate with a pattern forming material, patterning the organic film, and forming a composite film by infiltering a metal compound into the patterned organic film to obtain a mask pattern composed of the composite film. The pattern forming material contains a polymer including a first monomer unit represented by general formula (1) stated above.

According to another embodiment, a method of manufacturing a semiconductor device is disclosed. The method includes forming an organic film on a target film on a semiconductor substrate with a pattern forming material, patterning the organic film, forming a mask pattern composed of a composite film by infiltering a metal compound into the patterned organic film, and processing (pattering) the target film by using the mask pattern. The pattern forming material contains a polymer including a first monomer unit by general formula (1) represented above.

Hereinafter, various embodiments will be explained in detail with reference to the drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing therein above are marked with like reference numerals, and a detailed description is omitted as appropriate.

Components in the embodiments include ones which can be easily arrived by the person skilled in the art. Components in the embodiments also include ones which are substantially the same.

A polymer is a polymer formed by polymerization of monomers, and the polymer consists of repeating units derived from the monomers. In the specification, the repeating unit constituting the polymer is referred to as a monomer unit. The monomer unit is a unit derived from a monomer, and a constituent monomer of the monomer unit means a monomer to form the monomer unit by the polymerization. A monomer unit represented by the general formula (1) in the specification is also mentioned as a monomer unit (1). Also in a case of a monomer unit and a compound represented by another general formula or chemical formula, similarly, the monomer unit and the compound are sometimes represented by marks of the general formula or the chemical formula.

In consideration of the above-described requirement, the present inventors have found that an organic film, formed by a pattern forming material containing a specific polymer to be patterned, and thereafter a composite film obtained by infiltering a metal compound to the organic film,is used as a mask pattern, it is possible to obtain a mask pattern having high etch resistance. Here, infiltering a metal compound to an organic film is referred as "metallization". Specifically, the metallization can be performed by binding the metal compound to a portion of the organic film having the portion to which the metal compound can be bonded. After binding, the metal compound may be subjected to post-treatment such as oxidation, for example. Hereinafter, a pattern forming material containing the specific polymer according to the embodiment will be explained.

[Pattern Forming Material]

A pattern forming material of the embodiment contains a polymer (hereinafter, also mentioned as a "polymer X") including a first monomer unit represented by the following general formula (1).

[Chemical formula 2]

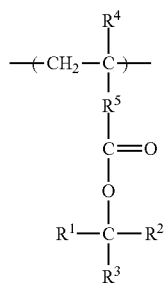

(1)

In the general formula (1), $R^1$, $R^2$ and $R^3$ each independently represent a hydrogen atom or a hydrocarbon group which may have an oxygen atom, at least one of $R^1$, $R^2$ and $R^3$ is a hydrocarbon group, where a total number of carbon atoms of $R^1$, $R^2$ and $R^3$ is 1 to 13, and $R^1$, $R^2$ and $R^3$ may be bonded to each other to form a ring. $R^4$ is a hydrogen atom or a methyl group. $R^5$ is a single bond, or a hydrocarbon group which has 1 to 20 carbon atoms and may have an oxygen atom, a nitrogen atom, or a sulfur atom between carbon-carbon atoms or at the terminal, and a hydrogen atom thereof may be substituted by a halogen atom.

The monomer unit (1) has a structure having ester of a carboxyl group at a terminal of a side chain. In the ester, a carbon atom (C of a group represented by —$CR^1R^2R^3$ in the general formula (1)) bonded to an oxygen atom next to a carbonyl group is primary carbon, secondary carbon or tertiary carbon. The monomer unit (1) has such a side chain, thereby making it possible to obtain a composite film in which the metal compound is firmly bonded to the organic film obtained from the pattern forming material, as follows.

The pattern forming material is used for forming the organic film on a target film of a substrate having the target film. The pattern forming material is dissolved in an organic solvent in the later-described composition for pattern formation of the embodiment, and applied on the target film by using the composition to form the organic film, for example.

The organic film may be composed of the pattern forming material itself, or may be formed by reaction of components which the pattern forming material contains. After the organic film is patterned, the composite film is formed by binding the metal compound to the first monomer unit which the organic film has. Then, the composite film is used as the mask pattern, and the above-described target film is processed.

In the polymer X, a reaction in which the metal compound is bonded to the monomer unit (1) being the first monomer unit is, for example, a reaction represented by the following reaction formula (F). The reaction represented by the reaction formula (F) is a reaction as an example in a case of using trimethylaluminium (TMA) as the metal compound. At least one of $R^1$, $R^2$ and $R^3$ in the monomer unit (1) is a hydrocarbon group. In the reaction formula (F), $R^1$ of the monomer unit (1) is set as a hydrocarbon group, $R^2$ and $R^3$ are set as hydrogen atoms or the hydrocarbon groups, and a bond of TMA to the monomer unit (1) is explained. n represents the repeating number of monomer units (1) in the polymer X.

When TMA comes to react with the monomer unit (1) in the polymer X, Al of TMA is coordinated to a lone electron pair of =O of the carbonyl group which the monomer unit (1) has. At the same time, bonding between ester and a primary, secondary or tertiary hydrocarbon group (—$CR^1R^2R^3$) at a side chain terminal of the monomer unit (1) is presumed to become weak. As a result, —$CR^1R^2R^3$ is cleaved from the monomer unit (1), and a monomer unit represented by a general formula (1') in which Al of TMA is bonded to two oxygen atoms derived from ester is formed.

The cleaved hydrocarbon group is recovered as $R^{1'}$=$CR^2R^3$. Here, $R^{1'}$ is a group in which one hydrogen atom has left from $R^1$. Note that a leaving group is described as $R^{1'}$=$CR^2R^3$ for convenience in the reaction formula (F), but there can also be a case of $R^1C$=$R^{2'}R^3$ ($R^{2'}$ is a group in which one hydrogen atom has left from $R^2$) or $R^1C$=$R^{3'}R^2$ ($R^{3'}$ is a group in which one hydrogen atom has left from $R^3$). Thus, a hydrogen atom comes off the leaving group to become alkene, which is cleaved. It is assumed that the hydrogen atom which has come off the leaving group is substituted for a methyl group of TMA to be cleaved from TMA as methane.

When the metal compound is bonded to the monomer unit (1) being the first monomer unit in polymer X, it is thought that the cleaved hydrocarbon group takes the reaction represented by the following reaction formula (G) separately from the process of the above reaction formula (F). In other words, it can be assumed that $R^1C^+R^2R^3$ is cleaved from the monomer unit (1) for convenience as shown in the reaction formula (G) and then $R^1C^+R^2R^3$ is bonded to $(CH_3)^-$ cleaved from TMA, and leaving the main chain as $R^1CCH_3R^2R^3$.

[Chemical formula 3]

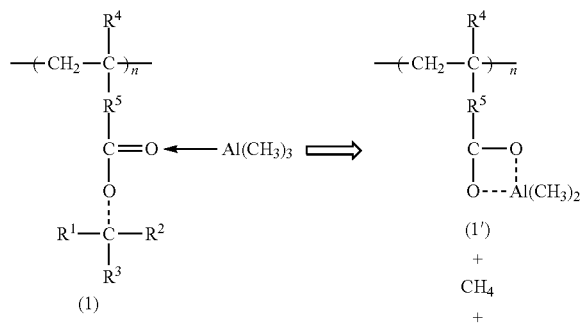

[Chemical formula 4]

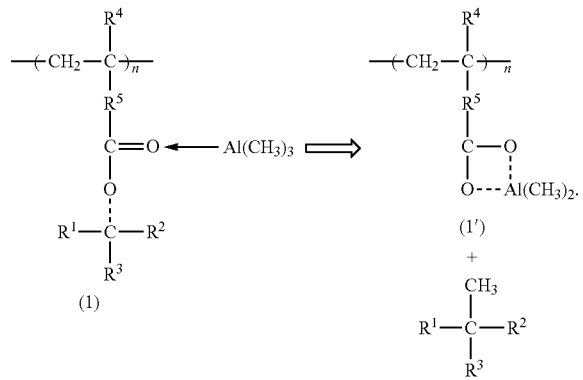

The primary, secondary or tertiary hydrocarbon group ($-CR^1R^2R^3$) ester-bonded at a side chain terminal of the monomer unit (1) is cleaved by a specific condition even in a case where the metal compound such as TMA is not adsorbed to the carbonyl group of the monomer unit (1). However, as represented by the reaction formula (F), when the metal compound such as TMA is coordinated to the carbonyl group of the monomer unit (1), the cleavage of the hydrocarbon group ($-CR^1R^2R^3$) can be achieved under a significantly milder condition than the above-described specific condition. This is a phenomenon newly confirmed by the present inventors, and this allows the metal compound to be firmly bonded to the polymer and can be said to be excellent in productivity in the metallization of the organic film formed by using the pattern forming material.

Note that the metallization is performed with respect to the organic film formed by using the pattern forming material in the embodiment. The organic film formed by using the pattern forming material as described above may be composed of the pattern forming material itself, or may be formed by reaction of the components which the pattern forming material contains.

In the pattern forming material, the organic film formed from the polymer X preferably has at least the structure of the side chain of the monomer unit (1) as it is. This makes it possible that the composite film obtained by metallizing the organic film has, for example, a structure in which $Al(CH_3)_x$ (X is a number of 0 to 2, and is 2 in the monomer unit (1')) being the metal compound is firmly bonded to two oxygen atoms of the monomer unit (1') as represented by the monomer unit (1').

Further, it can be assumed a structure, for example, in which AlY (Y is an optional substituent such as methyl group or hydroxyl group) being the metal compound is bonded to two or more carbonyl groups as represented by the following general formula (3). In this case, it is thought that the metal compound is more firmly bonded to the monomer unit than the case the metal compound such as $Al(CH_3)_x$ is bonded to one carbonyl group as represented by the general formula (1') in the above reaction formulas (F) and (G). The number of carbonyl groups to form coordination bonds depends on a kind of metal and a steric hindrance of a polymer matrix surrounding the metal.

[Chemical formula 5]

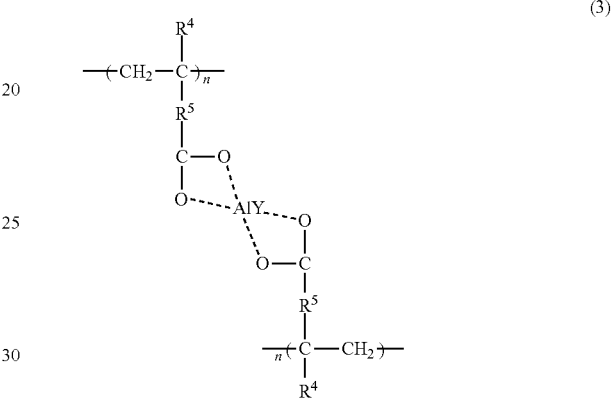

In the monomer unit (1), C of $-CR^1R^2R^3$ is a primary carbon, a secondary carbon or a tertiary carbon. That is, $R^1$, $R^2$ and $R^3$ each independently represent a hydrogen atom or a hydrocarbon group, at least one of these is a hydrocarbon group. In addition, when $R^1$, $R^2$ and $R^3$ are hydrocarbon groups they may contain an oxygen atom respectively. Hereinafter, the state containing the oxygen atom is included in the case called the hydrocarbon group about $R^1$, $R^2$ and $R^3$. When the hydrocarbon group contains an oxygen atom, the oxygen atom may be connected between two carbon atoms like C—O—C or may be connected to one carbon atom like C=O.

When C of $-CR^1R^2$, $R^3$ is a primary carbon, any one of $R^1$, $R^2$ and $R^3$ is a hydrocarbon group, and the two others are hydrogen atoms. When C of $-CR^1R^2R^3$ is a secondary carbon, any two of $R^1$, $R^2$ and $R^3$ are hydrocarbon groups, and the other is a hydrogen atom. When C of $-CR^1R^2R^3$ is a tertiary carbon, $R^1$, $R^2$ and $R^3$ are all hydrocarbon groups. Note that the total number of carbon atoms of $R^1$, $R^2$ and $R^3$ is 1 to 13 and the total number of carbon atoms of $-CR^1R^2R^3$ is 2 to 14.

Any two or three of $R^1$, $R^2$ and $R^3$ may be bonded to each other to form a ring. In this case the ring to be formed may be a heterocyclic ring which includes an oxygen atom. Further, it means that $-CR^1R^2R^3$, for example, indicates a monovalent aromatic hydrocarbon group like phenyl group ($-C_6H_5$) that three of $R^1$, $R^2$ and $R^3$ are bonded to form a ring. When the ring is formed, the number of carbon atoms of the ring is 3 to 14. The ring may be polycyclic within the range of above number of carbon atoms, and may be substituted for the hydrocarbon group which hydrogen atoms binding to the ring may have an oxygen atom. The hydrocarbon groups as the substituent include an alkyl group, aralkyl groups, an aryl group.

The present inventors have confirmed that in a case of a monomer unit in which a group ester-bonded at a terminal of a side chain is $CH_3$ in the general formula (1), namely in a case out of a range of the embodiment, for example, in the metallization using TMA, Al of TMA is absorbed to a lone electron pair of =O of a carbonyl group, but a $CH_3$ group is difficult to be cleaved from the terminal of the side chain. Accordingly, in such a monomer unit, it is substantially impossible to form a structure of the monomer unit (1') in which Al of TMA is bonded to two oxygen atoms derived from ester bond.

Note that a degree of metallization in the composite film can be confirmed by measuring an amount of metal which the metal compound in the composite film has by X-ray photoelectron spectroscopy (XPS). Further, the structure in which the metal of the metal compound is bonded to two oxygen atoms derived from ester bond which the monomer unit (1) in the organic film has at a terminal of a side chain can be estimated by infrared spectroscopy (IR). That is, in the organic film before the metallization, absorption of carbonyl derived from ester can be seen, and on the other hand, the absorption is attenuated after the metallization, while a peak derived from a carbonium ion is newly detected, thereby making it possible to estimate the structure in which the metal of the metal compound is bonded to the two oxygen atoms derived from ester bond which the monomer unit (1) in the organic film has at the terminal of the side chain.

Here, it is calculated that a stabilization energy of Al and O in a state where Al of TMA is coordinated to a lone electron pair of =O of a carbonyl group is 15 kcal/mol. Meanwhile, in the structure in which Al of TMA is bonded to two oxygen atoms derived from ester bond in the monomer unit (1'), it can be calculated that a bond energy between Al and the two oxygen atoms is 130 kcal/mol. In order to obtain such a firm bond, in the monomer unit (1), C of —$CR^1R^2R^3$ is a primary carbon, a secondary carbon or a tertiary carbon.

Further, hydrocarbon obtained by cleavage from a terminal of a side chain of the monomer unit (1) at the occasion of metallization, for example, $R^1{'}=CR^2R^3$ in the reaction formula (F) is preferably removed from the composite film. For that purpose, the total number of carbon atoms of $R^1$, $R^2$ and $R^3$ is 1 to 13. The total number of carbon atoms of $R^1$, $R^2$ and $R^3$ is preferably 1 to 9, and more preferably 1 to 3.

When the composite film obtained by using the pattern forming material is used as an underlayer film of the later-described multilayer mask structure, if C in —$CR^1R^2R^3$ is the tertiary carbon, —$CR^1R^2R^3$ may be cleaved from the monomer unit (1) under a relatively mild condition. That is, in such a case where another layer is formed on the organic film as the multilayer mask structure, when C in —$CR^1R^2R^3$ is the tertiary carbon, there is a possibility that —$CR^1R^2R^3$ in the organic film is cleaved during the formation of the layer. When —$CR^1R^2R^3$ which the first monomer unit has is decomposed and forms a carboxylic acid, the formed carboxylic acid may become an acid catalyst and may make neighboring ester bonds to hydrolyze more if it is heated. It may be preferable for C in —$CR^1R^2R^3$ to be the primary carbon or secondary carbon depending on temperature where the underlayer film is formed, because in the case where C in —$CR^1R^2R^3$ is the primary carbon or secondary carbon, —$CR^1R^2R^3$ is more difficult to be cleaved compared with the case of the tertiary carbon.

Specifically as —$CR^1R^2R^3$, in a case where C in —$CR^1R^2R^3$ is the tertiary carbon, $R^1$, $R^2$ and $R^3$ are each independently a methyl group, an ethyl group, a propyl group, a butyl group, a pentyl group, a hexyl group, a heptyl group, an octyl group or the like, and there can be cited a hydrocarbon group in which a total number of carbon atoms is 3 to 13. Among these, as —$CR^1R^2R^3$, a t-butyl group in which all of $R^1$, $R^2$, and $R^3$ are methyl groups is preferred.

In a case where C in —$CR^1R^2R^3$ is the secondary carbon, for example, when $R^3$ is set as a hydrogen atom, $R^1$ and $R^2$ are each independently a methyl group, an ethyl group, a propyl group, a butyl group, a pentyl group, a hexyl group, a heptyl group, an octyl group, a nonyl group or the like, and there can be cited a hydrocarbon group in which a total number of carbon atoms is 2 to 13. Among these, as —$CR^1R^2R^3$ (where, $R^3$ is H), an isopropyl group in which both of $R^1$ and $R^2$ are methyl groups, an s-butyl group in which $R^1$ and $R^2$ are a methyl group and an ethyl group respectively, a 3-pentyl group in which $R^1$ and $R^2$ are each an ethyl group, a 4-heptyl group in which $R^1$ and $R^2$ are each a propyl group, or a 5-nonyl group in which $R^1$ and $R^2$ are each an n-butyl group is preferred.

In a case where C in —$CR^1R^2R^3$ is the primary carbon, when $R^2$ and $R^3$ are set as hydrogen atoms, $R^1$ is a methyl group, an ethyl group, a propyl group, a butyl group, a pentyl group, a hexyl group, a heptyl group, an octyl group, a nonyl group, a decyl group or the like, and there can be cited a hydrocarbon group in which a total number of carbon atoms is 1 to 13. Among these, as —$CR^1R^2R^3$ (where, $R^2$ and $R^3$ are H), an ethyl group in which $R^1$ is a methyl group, or a propyl group in which $R^1$ is an ethyl group is preferred. As $R^1$ of —$CR^1R^2R^3$ (where, $R^2$ and $R^3$ are H), a benzyl group is also preferred.

In —$CR^1R^2R^3$, as an example in which any two or three of $R^1$, $R^2$ and $R^3$ are bonded to each other to form a ring, there can be cited an adamantyl group, a methyl adamantyl group, a pyranyl group, a cyclohexyl group, a 4-t-butylcyclohexyl group, an isobornyl group, a phenyl group, a naphthyl group, an anthracenyl group, a benzoylphenyl group or the like.

$R^5$ in the general formula (1) is a single bond, or a hydrocarbon group which has 1 to 20 carbon atoms and may have an oxygen atom, a nitrogen atom, or a sulfur atom between carbon-carbon atoms or at a bond terminal, and a hydrogen atom thereof may be substituted by a halogen atom. As the halogen atom, F, Cl, or Br can be selected. When $R^5$ is a single bond, a constituent monomer is (meth)acrylate being ester of a (meth)acrylic acid in the monomer unit (1). Note that the (meth)acrylic acid in the specification is a generic name for an acrylic acid and a methacrylic acid. The (meth)acrylate is a generic name for acrylate and methacrylate.

The hydrocarbon group when $R^5$ of the monomer unit (1) is the hydrocarbon group may be a linear, a branched chain, or a ring, or may be a combination of these. The ring may be an aliphatic ring or an aromatic ring, and the aromatic ring is preferred from the point of etch resistance of the obtained composite film. The number of carbon atoms of $R^5$ is preferably 1 to 10 in a case of having no ring, and preferably 6 to 18 in a case of having the ring. When $R^5$ is the hydrocarbon group, it may include an oxygen atom, a nitrogen atom, or a sulfur atom between carbon-carbon atoms or at a bond terminal, and a halogen atom may be substituted for a hydrogen atom. $R^5$ is preferably a hydrocarbon group having no hetero atom. As an example of a case where $R^5$ is a hydrocarbon group having no hetero atom, there can be cited a 1,4-phenylene group, a 1,4-naphthalene group, a 1,4-anthracene group, or the like.

As the constituent monomers of the monomer unit (1), monomers presented in the following Table 1 can be more specifically selected. In Table 1, $R^1$ to $R^5$ is equivalent to $R^1$ to $R^5$ of the general formula (1) each. When columns of $R^1$, $R^2$ and $R^3$ are shown by collected all together, the column shows the group as —$CR^1R^2R^3$. Note that "1,4-Ph", "Ph", "Np" and "An" in Table 1 present a 1,4-phenylene group, a phenylene group, a naphthyl group, and an anthracenyl group, respectively.

TABLE 1

| Monomer abbreviation | $R^1$ | $R^2$ | $R^3$ | $R^4$ | $R^5$ |
|---|---|---|---|---|---|
| M-1 | $CH_3$ | $CH_3$ | H | $CH_3$ | — |
| M-2 | $CH_3$ | $CH_3$ | $CH_3$ | $CH_3$ | — |
| M-3 | $CH_3$ | $CH_2$—$CH_3$ | H | $CH_3$ | — |
| M-4 | $CH(CH_3)_2$ | H | H | $CH_3$ | — |
| M-5 | $CH_2$—$CH_2$—$CH_3$ | $CH_3$ | H | $CH_3$ | — |
| M-6 | $CH_3$ | $CH_3$ | H | H | — |
| M-7 | $CH_3$ | $CH_3$ | $CH_3$ | H | — |
| M-8 | $CH_3$ | $CH_2$—$CH_3$ | H | H | — |
| M-9 | $CH(CH_3)_2$ | H | H | H | — |
| M-10 | $CH_2$—$CH_2$—$CH_3$ | $CH_3$ | H | H | — |
| M-11 | $CH_3$ | $CH_3$ | H | H | 1,4-Ph |
| M-12 | $CH_3$ | $CH_3$ | $CH_3$ | H | 1,4-Ph |
| M-13 | $CH_3$ | $CH_2$—$CH_3$ | H | H | 1,4-Ph |
| M-14 | $CH(CH_3)_2$ | H | H | H | 1,4-Ph |
| M-15 | $CH_2$—$CH_2$—$CH_3$ | $CH_3$ | H | H | 1,4-Ph |
| M-16 | Ph | | | $CH_3$ | — |
| M-17 | Ph | | | H | — |
| M-18 | Np | | | $CH_3$ | — |
| M-19 | Np | | | H | — |
| M-20 | An | | | $CH_3$ | — |
| M-21 | An | | | H | — |
| M-22 | Ph | H | H | $CH_3$ | — |
| M-23 | Ph | H | H | H | — |
| M-24 | Ph—C(=O)—Ph | | | $CH_3$ | — |
| M-25 | Ph—C(=O)—Ph | | | H | — |

In Table 1, M-1 and M-6 are an isopropyl methacrylate and isopropyl acrylate, respectively. M-2 and M-7 are t-butyl methacrylate and t-butyl acrylate, respectively. M-3 and M-8 are s-butyl methacrylate and s-butyl acrylate, respectively. M-4 and M-9 are i-butyl methacrylate and i-butyl acrylate, respectively. M-5 and M-10 are s-pentyl methacrylate and s-pentyl acrylate, respectively. M-11 is 4-vinyl benzoic acid isopropyl ester. M-12 is 4-vinyl benzoic acid t-butyl ester. M-13 is 4-vinyl benzoic acid s-butyl ester. M-14 is 4-vinyl benzoic acid i-butyl ester. M-15 is 4-vinyl benzoic acid s-pentyl ester. M-16 and M-17 are a phenyl methacrylate and phenyl acrylate, respectively. M-18 and M-19 are a naphthyl methacrylate and naphthyl acrylate, respectively. M-20 and M-21 are an anthracenyl methacrylate and anthracenyl acrylate, respectively. M-22 and M-23 are a benzyl methacrylate and benzyl acrylate, respectively. M-24 and M-25 are a benzoylphenyl methacrylate and benzoylphenyl acrylate, respectively.

As the constituent monomers of the first monomer unit, among these, monomers M-11 to M-25 are preferred. Hereinafter, a monomer unit based on the monomer M-1 is mentioned as a monomer unit M-1. Hereinafter, the other monomers and monomer units are also similarly written.

The polymer X may contain one kind of the first monomer unit, or may contain two or more kinds of the first monomer units. The polymer X may be constituted of the first monomer unit alone, or may be a copolymer of the first monomer unit and a monomer unit other than the first monomer unit. A molar ratio of the first monomer unit in the polymer X is preferably 50 mol % or more, more preferably 80 mol % or more, and further preferably 90 mol % or more to all the monomer units of the polymer X.

The polymer X has the first monomer unit, thereby making it possible to achieve both an excellent metallization property in the organic film obtained from the pattern forming material containing this and high etch resistance in the obtained mask pattern. From the viewpoints of such a metallization property and etch resistance, the ratio of the first monomer unit in the polymer X is preferably 50 mol % or more, and when such other properties as described later are not considered, it is particularly preferably 100 mol %.

The polymer X can be manufactured by a normal method by using the constituent monomer of the monomer unit, for example, by bulk polymerization, solution polymerization, emulsion polymerization, suspension polymerization, or the like. The solution polymerization is preferred from the viewpoints of excluding an impurity such as an emulsifier or water when dissolving the obtained polymer. When the polymer X is synthesized by the solution polymerization, normally, a predetermined monomer is dissolved in a polymerization solvent and polymerized under the presence of a initiator. The monomer used for the manufacture of the polymer X includes the constituent monomer of the first monomer unit. As described later, when the polymer X includes another monomer unit other than the first monomer unit, constituent monomers of all the monomer units constituting the polymer X are used for the polymerization. Polymerization conditions such as an amount of the polymerization solvent, a polymerization temperature, and a polymerization time are appropriately selected according to the kind of monomer, a molecular weight of the polymer X to be synthesized, and the like.

A weight-average molecular weight (Mw) of the polymer X is preferably 1,000 to 1,000,000 [g/mol] (hereinafter, a unit is sometimes omitted), more preferably 2,000 to 1,000,000, and particularly preferably 2,000 to 100,000. The molecular weight (Mw) of the polymer X can be measured by gel permeability chromatography (GPC).

Note that the metal compound bonded to the organic film in the above may be thereafter appropriately processed to be used as the mask pattern. For example, in a case of $Al(CH_3)_3$ represented by the reaction formula (F), after being bonded to the organic film, aluminum hydroxide, aluminum oxide, or the like may be formed by oxidation treatment. The oxidation treatment is performed normally by using an oxidant such as water, ozone, or oxygen plasma. Note that the oxidation treatment may be naturally performed by water in an atmosphere without special operation.

Further, an explanation has been made by exemplifying $Al(CH_3)_3$ as the metal compound bonded to the organic film in the above, but an Al compound other than $Al(CH_3)_3$ is applicable, and it is possible to obtain similar bond structures even in metal compounds of metals other than Al, for example, Ti, V, W, Hf, Zr, Ta, Mo and so on.

The composite film obtained by using the pattern forming material has high etch resistance since the metal compound is firmly bonded to the organic film. As for etching, reactive ion etching (RIE), ion beam etching (IBE), or the like can be selected, and it is possible to achieve sufficient resistance even in the IBE, where particularly high resistance is required. Here, in order to achieve a processing shape having a high aspect ratio with respect to the target film, the multi layer mask structure is sometimes employed in the mask pattern. The composite film formed by using the pattern forming material is suitably used as the underlayer film to be formed between a resist film and the target film when used for the multilayer mask structure.

Conventionally, in the multilayer mask structure aimed at high etch resistance, between the resist film and the target film, a carbon layer obtained by a chemical vapor deposition (CVD) method has been used as the underlayer film. The composite film formed by using the pattern forming material has the advantages of being inexpensive materials and allowing a film to be easily formed while having the function of the carbon deposited layer, which is formed using the very costly CVD method.

(Polymer X)

The pattern forming material contains the polymer including the above-described first monomer unit. In the polymer X, in order to impart a property (hereinafter, also mentioned as "another property") required other than the metallization property and the etch resistance as a material to form the mask pattern, within a range of not impairing the effect of the embodiment, the monomer unit other than the first monomer unit may be added.

As the other property for the polymer X, resistance to organic solvent of the obtained organic film may be required. This is a particularly required property when the pattern forming material is applied to the multilayer mask structure. In the multilayer mask structure, the organic film formed by using the pattern forming material as described above is preferably formed as the underlayer film between the resist film and the target film. In this case, normally, another layer constituting the multilayer mask is applied on the organic film by dissolving a material composing the layer in the organic solvent or the like, formed by what is called a wet coating method. At that time, when the organic film formed by using the polymer X is soluble to the organic solvent used for the wet coating method, there is a possibility that the organic film is partly dissolved to form a mixed layer with the composing materials of the layer formed on the organic film.

Thus, the present inventors have conceived that by introducing a second monomer unit having a crosslinkable functional group at a terminal of a side chain to the polymer X, in addition to the first monomer unit, elution of film components is suppressed in the obtained organic film. This makes it possible that the organic film formed by using the polymer X is difficult to dissolve with respect to the organic solvent, and even when an upper layer on the organic film is formed by the wet coating method, the mixed layer is hardly formed. Hereinafter, the polymer X having the second monomer unit in addition to the first monomer unit is sometimes mentioned as a crosslinkable polymer X.

The crosslinkable functional group which the second monomer unit has is not particularly limited as long as it is a functional group having crosslinkability, but from the viewpoint of storage stability, a functional group to exhibit a crosslinking function by energy from the outside, for example, by heating or light irradiation is preferred. As the crosslinkable functional group, a glycidyl group, an oxetanyl group, an amino group, an azido group, a thiol group, a hydroxyl group, a carboxyl group, or the like, can be selected and from the viewpoints where a structure after crosslinking is low in reactivity with the metal compound, and where energy required for a crosslinking reaction is relatively low, a glycidyl group, an oxetanyl group, a hydroxyl group, a carboxyl group, or a protected carboxyl group is particularly preferred.

As a constituent monomer of the second monomer unit, there can be cited a monomer in which a monovalent organic group having a crosslinkable functional group at a terminal is bonded to any carbon atom of an ethylene group. Specifically as the second monomer unit, a monomer unit (2) represented by the following general formula (2) can be cited.

[Chemical formula 6]

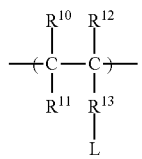

In the general formula (2), $R^{10}$, $R^{11}$ and $R^{12}$ are each independently a hydrogen atom or a hydrocarbon group having 1 to 10 carbon atoms, and $R^{13}$ is a single bond, or a hydrocarbon group which has 1 to 20 carbon atoms and may include an oxygen atom, a nitrogen atom, or an ester bond between carbon-carbon atoms or at a bond terminal, and L is a crosslinkable functional group.

As a constituent monomer of the second monomer unit, (meth)acrylate in which a compound having a crosslinkable functional group at a terminal is ester-bonded to (meth)acrylic acid, or a styrene derivative in which the compound having a crosslinkable functional group at a terminal is substituted is preferred.

A compound represented by the following general formula L1 can be cited specifically as (meth)acrylate having a glycidyl group in (meth)acrylate being the constituent monomer of the second monomer unit.

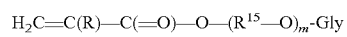

$$H_2C=C(R)-C(=O)-O-(R^{15}-O)_m-Gly \qquad L1$$

In the general formula L1, R is a hydrogen atom or a methyl group, and Gly is a glycidyl group. m is an integer of 0 to 3, and $R^{15}$ is an alkylene group having 1 to 10 carbon atoms. Specifically as (meth)acrylate represented by L1, glycidyl (meth)acrylate represented by the following general formula L1-1 can be selected. R in each of the following general formulas is a hydrogen atom or a methyl group.

[Chemical formula 7]

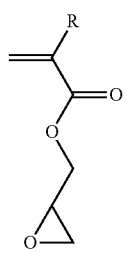

L1-1

(3-ethyl-3-oxetanyl)methyl(meth)acrylate represented by the following general formula L2-1 can be cited specifically as (meth)acrylate having an oxetanyl group in (meth)acrylate being the constituent monomer of the second monomer unit. R in the following general formula is a hydrogen atom or a methyl group.

[Chemical formula 8]

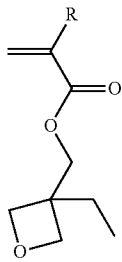

L2-1

A compound represented by the following general formula L3 can be cited specifically as a styrene derivative having a glycidyl group in styrene derivatives being the constituent monomer of the second monomer unit.

[Chemical formula 9]

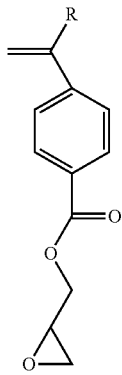

L3

A copolymer of the first monomer unit and the second monomer unit constituting the polymer X preferably has plenty of randomness, and it is sufficient that a combination of the first monomer unit and the second monomer unit is determined from the above viewpoint.

When the polymer X which the pattern forming material contains the second monomer unit, the polymer X may contain only one kind of the second monomer unit, or may contain two or more kinds of the second monomer units. When the polymer X contains one kind of the first monomer unit and two or more kinds of the second monomer units, the polymer X may be a mixture of two or more kinds of copolymers each including the first monomer unit and each of the second monomer units, or may be one kind of copolymer including one kind of the first monomer unit and two or more kinds of the second monomer units.

Further, when the polymer X contains two or more kinds of the first monomer units and one kind of the second monomer unit, the polymer X may be a mixture of two or more kinds of copolymers each including the second monomer unit and each of the first monomer units, or may be one kind of copolymer including two or more kinds of the first monomer units and one kind of the second monomer unit.

When the polymer X contains the first monomer unit and the second monomer unit, even in a case where the polymer X is the mixture of two or more kinds of copolymers or is composed of one kind of copolymer as described above, the crosslinkable functional groups of the second monomer units included in different polymer chains react with each other to be bonded, thereby crosslinking the respective main chains of a plurality of polymers to make the dissolution difficult. Note that the reaction of the crosslinkable functional groups is preferably performed by, for example, heating, light irradiation, or the like after the organic film is formed.

A molar ratio of the second monomer unit in the polymer X is preferably 0.5 mol % or more and less than 20 mol %, more preferably 1 mol % or more and less than 10 mol %, and further preferably 2 mol % or more and less than 10 mol % to all the monomer units constituting the polymer X.

When the ratio of the second monomer unit is less than 0.5 mol % to all the monomer units, the crosslinking in the polymer X cannot be sufficiently performed not to allow sufficient achievement in making it difficult to dissolve the polymer, resulting in a possibility that the component of the organic film is eluted to a wet coating solution used for forming the upper layer on the organic film. When the ratio of the second monomer unit is 20 mol % or more to all the monomer units, there is a possibility that high crosslink density causes diffusion of the metal compound into the organic film to be suppressed and prevents the organic film from being deeply metallized.

When the polymer X contains the second monomer unit, the first monomer unit can be selected from the monomer units derived from the monomers shown in Table 1. As the second monomer unit, the monomer unit L1-1 can be selected, and the polymer X can be constituted by combining the selected monomer units.

Hereinafter, a crosslinkable polymer X will be explained by exemplifying a case where the first monomer unit is the monomer unit M-1 and the second monomer unit is the monomer unit L1-1 (where, R is a methyl group). Hereinafter, when R is the methyl group in the monomer unit L1-1, M is denoted at the end of an abbreviation in the monomer unit to be mentioned as a monomer unit L1-1M. When R is a hydrogen atom, A is denoted at the end of an abbreviation in the monomer unit to be mentioned as a monomer unit L1-1A. A similar rule is also applied to other monomer units.

The following explanation is applied to the crosslinkable polymer X even when the first monomer unit is another first monomer unit other than the monomer unit M-1 and even when the second monomer unit is another second monomer unit other than the monomer unit L1-1M.

The following chemical formula X11 represents a chemical formula of the polymer X constituted by combining the monomer unit M-1 and the monomer unit L1-1M. The polymer represented by the chemical formula X11 is hereinafter mentioned as a polymer X11. Hereinafter, the other polymers are also similarly written.

[Chemical formula 10]

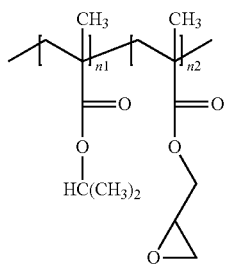

X11

The polymer X11 is constituted of the monomer unit M-1 and the monomer unit L1-1M. n2 represents a molar ratio of the monomer unit L1-1M to all the monomer units in the polymer X11, and n1 represents a molar ratio of the monomer unit M-1 to all the monomer units in the polymer X11. A total of n1 and n2 is 100 mol % in the polymer X11. Note that in the polymer X11, the monomer unit M-1 and the monomer unit L1-1M may be alternately present, or may be randomly present. The respective monomer units are preferably uniformly present according to a molar ratio between the respective monomer units.

When the polymer X which the pattern forming material contains is the crosslinkable polymer X, and constituted of only the polymer X11, n2 in the polymer X11 is preferably 0.5 mol % or more and less than 20 mol %, more preferably 1 mol % or more and less than 10 mol %, and further more preferably 2 mol % or more and less than 10 mol %, similarly to the above explanation. n1 is preferably more than 80 mol % and 99.5 mol % or less, more preferably more than 90 mol % and 99 mol % or less, and further more preferably more than 90 mol % and 98 mol % or less.

Note that the crosslinkable polymer X may be a mixture of the polymer X11 and another crosslinkable polymer X. For example, in the polymer X11, a mixture with the polymer X (hereinafter, polymer X12) containing another first monomer unit, for example, the monomer unit M-2, or the polymer X (hereinafter, polymer X13) containing the monomer unit M-3 in place of the monomer unit M-1 being the first monomer unit is applicable.

When the crosslinkable polymer X is a mixture of the polymer X11 and another crosslinkable polymer X, a molar ratio between the first monomer unit and the second monomer unit in each of the crosslinkable polymers need not necessarily fall within the above-described range. As the entire mixture, the molar ratio between the first monomer unit and the second monomer unit preferably falls within the above-described range.

For example, when the crosslinkable polymer X is a mixture of the polymer X11 and the polymer X12, a total of the monomer unit M-1 and the monomer unit M-2 is preferably more than 80 mol % and 99.5 mol % or less, and more preferably more than 90 mol % and 99 mol % or less with respect to all the monomer units totaling the polymer X11 and the polymer X12. Further, a total of the monomer units L1-1M in the polymer X11 and the polymer X12 is preferably 0.5 mol % or more and less than 20 mol %, and more preferably 1 mol % or more and less than 10 mol % with respect to all the monomer units totaling the polymer X11 and the polymer X12.

An adjustment of a ratio between the respective monomer units in the crosslinkable polymer X can be performed by adjusting a ratio between monomers to be used at a time of polymerization. A molecular weight (Mw) of the crosslinkable polymer X is preferably 1,000 to 100,000,000, and more preferably 2,000 to 100,000.

As the crosslinkable polymer X, a structure after crosslinking when the polymers X11 are used is represented by a chemical formula L-X11. As represented by the chemical formula L-X11, when the polymers X are crosslinked, epoxy rings of glycidyl groups which the monomer units L1-1M have are opened, and bonded to each other to be crosslinked by —$CH_2$—CH(OH)—$CH_2$— bond. In the chemical formula L-X11, n1 and n2 each independently represent a molar ratio of the monomer unit M-1 and the monomer unit L1-1M in each of the polymer chains.

[Chemical formula 11]

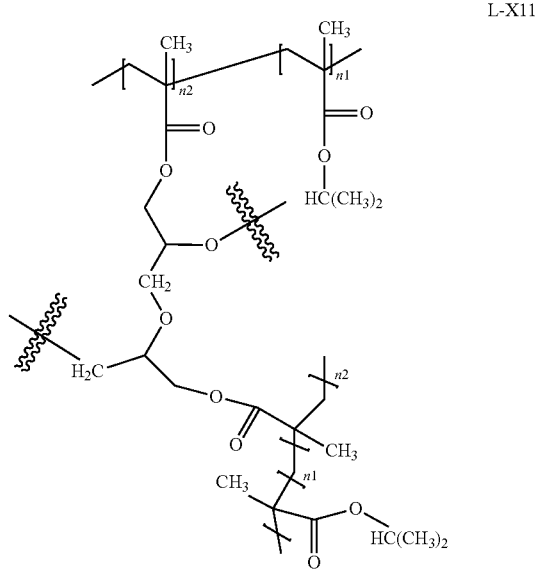

L-X11

Further, the epoxy rings can also have such a chemical formula as represented by a chemical formula L-X12 with a small amount of carboxylic acid in the system. In the chemical formula L-X12, na+nb=n2 is established, and n1 and n2 each independently represent a molar ratio of the monomer unit M-1 and the monomer unit L1-1M in each of the polymer chains.

[Chemical formula 12]

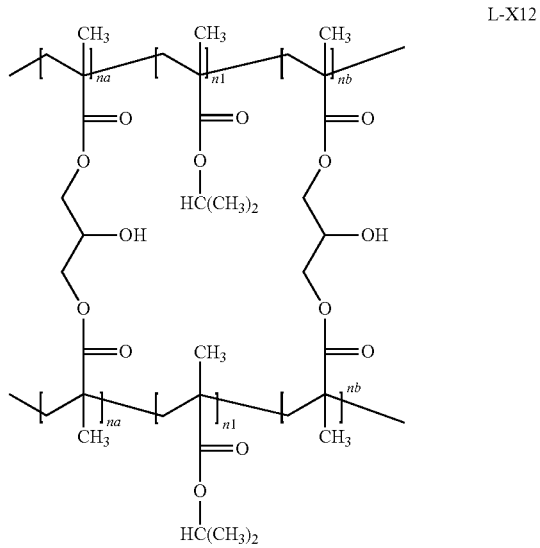

L-X12

The condition when the crosslinkable polymers X are crosslinked depends on the kind of crosslinkable functional group which the second monomer unit has. For example, when the crosslinkable functional group is a glycidyl group or an oxetanyl group, the crosslinking is performed by opening an epoxy ring or an oxetanyl ring. Accordingly, the polymers X are crosslinked by performing heating or light irradiation under the condition that the epoxy rings or the oxetanyl rings are opened. Note that when the crosslinkable polymers X are crosslinked, a curing agent may be used.

The curing agent has reactivity with respect to the crosslinkable functional group, and allows the crosslinkable functional groups to be bonded to each other via the curing agent. The curing agent promotes a crosslinking reaction and makes the crosslinking of the polymers X easy. Accordingly, a suitable curing agent is different depending on the kind of the second monomer unit. For example, when the crosslinkable functional group which the second monomer unit has is a glycidyl group, an amine compound, a compound having an acid anhydride structure, a compound having a carboxylic acid, or a compound having a hydroxyl group can be suitably used as the curing agent.

The amine compound has a plurality of primary amines or secondary amines in a structure. As the amine compound usable for the curing agent, for example, there is ethylenediamine, trimethylenediamine, tetramethylenediamine, pentamethylenediamine, hexamethylenediamine, heptamethylenediamine, octamethylenediamine, nonamethylenediamine, decamethylenediamine, diethylenetriamine, triethylenetetramine, tetraethylenepentamine, pentaethylenehexamine, 1,2-diaminocyclohexane, 1,3-diaminocyclohexane, 1,4-diaminocyclohexane, o-phenylenediamine, m-phenylenediamine, p-phenylenediamine, m-xylenediamine, p-xylenediamine, isophorondiamine, 4,4'-methylenedianiline, diaminodiphenylsulfone, diaminodiphenyl ether, or the like.

As the compound having an acid anhydride skeleton, usable for the curing agent, for example, there is a hexahydrophthalic anhydride, a 4-methylhexahydrophthalic anhydride, a succinic anhydride, an itaconic anhydride, a dodecenylsuccinic anhydride, or the like.

As the compound having a carboxylic acid, usable for the curing agent, for example, there is a hexahydrophthalic acid, a 4-methylhexahydrophthalic acid, a succinic acid, an itaconic acid, a dodecenylsuccinic acid, a citric acid, a terephthalic acid, or the like.

The compound having a hydroxyl group includes a plurality of hydroxyl groups in a skeleton. As the compound having a hydroxyl group, usable for the curing agent, for example, there is polyphenol, 1,4-benzenediol, 1,3-benzenediol, 1,2-benzenediol, ethylene glycol, or the like.

Note that in order to enhance the reactivity of the curing agents other than the above-cited amine compounds, a curing accelerator having tertiary amine may be added. As such a curing accelerator, for example, there is cyandiamide, 1,8-diazabicyclo(5,4,0)-undecene-7, 1,5-diazabicyclo(4.3.0)-nonene-5, tris(dimethylaminomethyl)phenol, ethylene glycol, or the like.

When the pattern forming material contains the curing agent with the crosslinkable polymer X, an amount of the curing agent is preferably an amount in which a ratio of a reactive group to the crosslinkable functional group which the curing agent has is 0.01 to 1 mol to 1 mol of the crosslinkable functional group which the crosslinkable polymer X has.

The polymer X which the pattern forming material contains may further include another monomer unit (hereinafter, mentioned as "different monomer unit") other than the first monomer unit and the second monomer unit if necessary. In the polymer X, having the different monomer unit makes it possible to adjust solubility of the polymer X to the organic solvent, film formability at a time of applying a composition containing the polymer X, a glass transition temperature of the film after applying the composition, and the like.

As a monomer constituting the different monomer unit, for example, styrene, 1-vinyl naphthalene, 2-vinyl naphthalene, 9-vinyl anthracene, vinylbenzophenone, hydroxystyrene, methyl(meth)acrylate, (meth)acrylic acid, 4-vinyl benzoic acid methyl ester, 4-vinyl benzoic acid or the like, can be selected. The different monomer unit can be constituted of at least any one of these monomers. A molar ratio of the different monomer unit is preferably 50 mol % or less, more preferably 10 mol % or less, and further preferably 1 mol % or less to all the monomer units constituting the polymer X. Setting the different monomer unit to 50 mol % or less makes it possible to keep the molar ratio of the first monomer unit in the organic film high, and firmly bond a larger amount of the metal compound in the organic film.

The pattern forming material may contain a component other than the polymer X as necessary within a range of not impairing the effect of this embodiment besides the polymer X. As the component other than the polymer X, typically, the above-described curing agent and curing accelerator can be selected. As a component other than the curing agent and the curing accelerator, a thermal acid generator, a photoacid generator, or the like can be added. The content of the component other than the polymer X in the pattern forming material can be appropriately selected according to each of the components. For example, the curing agent is as explained above. The content of the component other than the polymer X other than the curing agent is preferably 1 mass % or less, and more preferably 0.1 mass % or less to the total amount of the pattern forming material.

A method of forming the organic film by using the pattern forming material may be a dry coating method, or a wet coating method. When the organic film is formed by the dry coating method, the organic film can be formed by the dry coating method, for example, a vapor disposition method by using the pattern forming material itself. When the organic film is formed by the wet coating method, a method of applying and drying a composition including the pattern forming material and the organic solvent on the target film to form the organic film is preferred.

(Embodiment of Composition for Pattern Formation)

A composition for pattern formation (hereinafter, also simply mentioned as "composition") of the embodiment is a composition in which an organic film is formed by using a pattern forming material to be patterned on a target film of a substrate having the target film, and thereafter a composite film obtained by infiltering a metal compound to the organic film, is used as a mask pattern when the target film is processed, and which includes the pattern forming material for forming the organic film, and the composition contains the pattern forming material containing the polymer including the first monomer unit represented by the above-described general formula (1) and the organic solvent capable of dissolving the pattern forming material.

As the pattern forming material in the composition of the embodiment, the pattern forming material of the embodiment described above can be used. The composition of the embodiment can be used for a similar use to that of the one explained above in the pattern forming material. The organic solvent in the composition of the embodiment is not particularly limited as long as it is an organic solvent to dissolve the pattern forming material, particularly the polymer X which the pattern forming material contains.

As the organic solvent to dissolve the polymer X, aromatic hydrocarbons such as toluene, xylene, and mesitylene, ketones such as cyclohexanone, acetone, ethyl methyl ketone, and methyl isobutyl ketone, or cellosolves such as methyl cellosolve, methyl cellosolve acetate, ethyl cellosolve acetate, butyl cellosolve acetate, and propylene glycol monomethyl ether acetate (PGMEA), and are preferred. The organic solvent can be used by combining two or more kinds of them as necessary.

The content of the pattern forming material in the composition of the embodiment is preferably 1 to 30 mass %, more preferably 1 to 20 mass %, and further preferably 1 to 15 mass % with respect to the entire composition. The content of the organic solvent in the composition of the embodiment is preferably 70 to 99 mass %, more preferably 80 to 99 mass %, and further preferably 85 to 99 mass % with respect to the entire composition. The content of each of the pattern forming material and the organic solvent in the composition of the embodiment falls within the above-described range, thereby making it possible to perform well in formation of the organic film onto the target film by the wet coating method.

As a coating method of the composition of the embodiment on the target film by the wet coating method, a normal method is applicable. Specifically, spin coating or dip coating is preferred. Thereafter, the organic film can be formed by removing the organic solvent from an applied film of the composition by drying. When the polymer X is the crosslinkable polymer X, crosslinking treatment according to the crosslinkable polymer X to be used after organic film formation, for example, heating or light irradiation is performed to crosslink.

Here, when the organic film is formed by using the composition of the embodiment, the organic film is preferably formed under the condition that —CR$^1$R$^2$R$^3$ is not-cleaved from the first monomer unit. If —CR$^1$R$^2$R$^3$ is cleaved from the first monomer unit when the organic film is formed, there is a possibility that uniform metallization does not occur throughout the film thickness at the occasion of metallization to be performed thereafter. It is highly likely that a firm bond between the organic film and the metal compound cannot be achieved.

(Embodiment of Pattern Forming Method and Method of Manufacturing Semiconductor Device)

A pattern forming method of the embodiment has the following (A1) to (C) processes.

(A1) A process of forming an organic film on a substrate by using a pattern forming material containing a polymer including a monomer unit (1)

(B) A process of patterning the organic film obtained in (A1)

(C) A process of forming a composite film by infiltering a metal compound to the patterned organic film to obtain a mask pattern composed of the composite film A method of manufacturing a semiconductor device of the embodiment has the following (A) to (D) processes.

(A) A process of forming an organic film on a target film of a semiconductor substrate having the target film by using a pattern forming material containing a polymer including a monomer unit (1)

(B) A process of patterning the organic film obtained in (A)

(C) A process of forming a composite film by infiltering a metal compound to the patterned organic film to obtain a mask pattern composed of the composite film (D) A process of processing the target film by using the mask pattern As a pattern forming material to be used in the pattern forming method and the method of manufacturing the semiconductor device of the embodiment, the pattern forming material explained above is applicable.

Hereinafter, the method of manufacturing the semiconductor device of the embodiment will be explained by FIG. 1A to FIG. 1E. Here, the processes of (A1), (B), and (C) in the pattern forming method of the embodiment correspond to the processes of (A), (B), and (C) in the method of manufacturing the semiconductor device of the embodiment, respectively. Accordingly, to each of the processes of (A1), (B), and (C) in the pattern forming method of the embodiment, a specific method of each of the processes of (A), (B), and (C) in the below described method of manufacturing the semiconductor device can be similarly applied.

FIG. 1A to FIG. 1E are sectional views each illustrating one process of the method of manufacturing the semiconductor device according to the embodiment. In the method of manufacturing the semiconductor device of the embodiment, the processes progress in order of FIG. 1A to FIG. 1E.

FIG. 1A is a sectional view schematically illustrating the (A) process, namely, the process in which the organic film is formed on the target film of the semiconductor substrate having the target film by using the pattern forming material. In this embodiment, in order to process a target film 2 formed on a semiconductor substrate 1, an organic film 3 is formed from the pattern forming material.

In the (A) process, first, the semiconductor substrate 1 on which the target film 2 has been formed is prepared. The target film 2 may be a single layer film of a silicon oxide film or the like, or may be a multilayer film composing a three-dimensional memory cell array such as a NAND-type flash memory, or the like. In an example illustrated in FIG. 1A, the target film 2 is a multilayer film in which nitride films 21 and oxide films 22 are alternately layered.

Here, in the pattern forming method of the embodiment, the semiconductor substrate 1 may have the target film 2, but is not essential. Further, in the pattern forming method, a substrate of glass, quartz, mica, or the like can be used in place of the semiconductor substrate 1.

The pattern forming material is applied on the target film 2 of the semiconductor substrate 1. In a case of the dry coating method such as vapor deposition, for example, the pattern forming material itself is applied. In a case of the wet coating method such as spin coating or dip coating, the composition of the embodiment is applied. Next, if necessary, drying for removal of the organic solvent, or heating or light irradiation for crosslinking is performed to form the organic film 3 on the target film 2.

The drying is performed in a case of the wet coating method. The crosslinking is performed in a case where the polymer X which the pattern forming material contains is the crosslinkable polymer X. The crosslinking is achieved by bonding crosslinkable functional groups between different polymers to each other. When the curing agent or the like is added, such a bond of crosslinkable functional groups is performed via a molecule of the curing agent. At the occasion of the crosslinking, in order to promote a reaction, heating or light irradiation may be performed.

When the crosslinking is performed by heating, a heating temperature depends on the kinds of the crosslinkable functional group which the second monomer unit has and the curing agent. The heating temperature is preferably about 120° C. or higher, more preferably 160° C. or higher, and even more preferably 200° C. or higher. However, as mentioned above, the heating is preferably performed at a temperature at which —CR$^1$R$^2$R$^3$ is not cleaved from the first monomer unit. In addition, the heating is preferably performed at a temperature at which decomposition of a polymer main chain does not occur.

For example, when C of —$CR^1R^2R^3$ in the first monomer unit is the tertiary carbon, a heating temperature is preferably about 250° C. or lower, and more preferably 200° C. or lower. When C of —$CR^1R^2R^3$ is the secondary carbon, a heating temperature is preferably about 300° C. or lower, and more preferably 250° C. or lower. When C of —$CR^1R^2R^3$ is the primary carbon, a heating temperature is preferably about 350° C. or lower, and more preferably 300° C. or lower. Note that in a case of the wet coating method, normally, the drying, namely the removal of the organic solvent which the composition of the embodiment contains is performed together by this heating. Thus, the organic film 3 composed of the pattern forming material, or obtained by crosslinking the polymers X in the pattern forming material can be obtained.

Figure 1B:
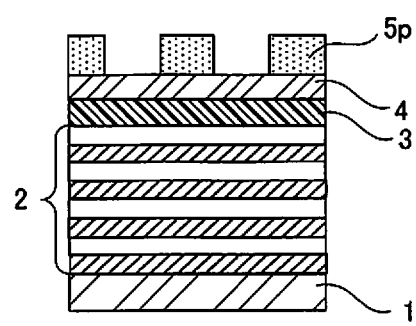
FIG. 1B is a view illustrating one process of the method of manufacturing the semiconductor device according to the embodiment.
Figure 1C:
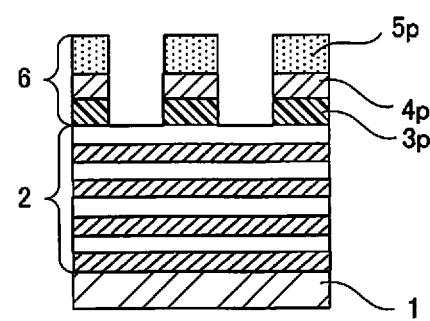
FIG. 1C is a view illustrating one process of the method of manufacturing the semiconductor device according to the embodiment.

FIG. 1B and FIG. 1C are cross-sectional views each schematically illustrating the (B) process, namely, the process in which the organic film 3 obtained in the (A) process is patterned. The organic film 3 functions as a base layer of a multilayer mask structure 6 as illustrated in FIG. 1B and FIG. 1C. FIG. 1B illustrates a state in which a silicon oxide film 4 is formed as a functional film to be patterned and a resist pattern 5p is formed thereon on the organic film 3.

The silicon oxide film 4 is formed by, for example, heating a SOG (Spin On Glass) film formed on the organic film 3 by the following method at a predetermined temperature, for example, 150° C. to 300° C. However, similarly to the above, the heating is preferably performed at a temperature at which —$CR^1R^2R^3$ is not cleaved from the first monomer unit. The SOG film is formed by spin-coating a wet coating solution in which components of the SOG film have been dissolved in an organic solvent on the organic film 3.

At this time, an unillustrated antireflection film may be formed on the silicon oxide film 4. The antireflection film allows precision exposure by preventing reflection from a base when a resist film to be formed by the following treatment is patterned. As the antireflection film, there can be used a material of a novolac resin, a phenol resin, polyhydroxystyrene, or the like.

Next, the resist film is formed on the silicon oxide film 4, and the resist film is formed into the resist pattern 5p by using a lithography technology, an imprint technology, or the like. In the imprint technology, the resist pattern 5p is formed by dropping a resist on the silicon oxide film 4, pressing a template in which a fine pattern has been formed to the resist film, and curing the resist film by irradiation with ultraviolet rays.

FIG. 1C is the cross-sectional view illustrating a state after etching-processing the silicon oxide film 4 while using the resist pattern 5p as a mask, to form a silicon oxide film pattern 4p, and further etching-processing the organic film 3 while using the resist pattern 5p and the silicon oxide film pattern 4p as masks, to form the organic film pattern 3p. For example, the etching of the silicon oxide film 4 is performed by using a fluorine-based gas (F-base gas), and the etching of the organic film 3 is performed by using an oxygen-based gas ($O_2$-based gas). As illustrated in FIG. 1C, a structure in which the organic film pattern 3p, the silicon oxide film pattern 4p, and the resist pattern 5p are layered in this order is one example of the multilayer mask structure 6.

Note that when the antireflection film is formed on the silicon oxide film 4, the antireflection film is patterned ahead of the etching of the silicon oxide film 4. Note that after the formation of the silicon oxide film pattern 4p, a film thickness of the resist pattern 5p may be adjusted so that the resist pattern 5p etched away. Further, after the formation of the organic film pattern 3p, a film thickness of the silicon oxide film pattern 4p may be adjusted so that the silicon oxide film pattern 4p etched away.

When the organic film pattern 3p is formed based on the multilayer mask structure 6 as presented in this embodiment, before the process in which the composite film is formed by infiltering the metal compound to the patterned organic film (organic film pattern 3p) to obtain a mask pattern composed of the composite film, which is the (C) process, the silicon oxide film pattern 4p and the resist pattern 5p being upper layers of the organic film pattern 3p may be removed.

Figure 1D:
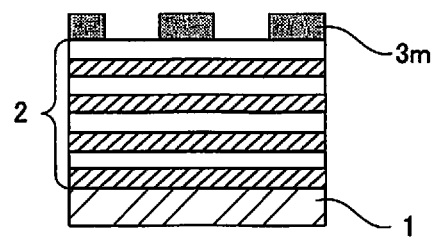
FIG. 1D is a view illustrating one process of the method of manufacturing the semiconductor device according to the embodiment.

FIG. 1D is a cross-sectional view illustrating a state after the (C) process, and the organic film pattern 3p illustrated in FIG. 1C is metallized to be present as a mask pattern 3m on the target film 2 on the semiconductor substrate 1. Note that in the process from the formation of the organic film 3 to the formation of the organic film pattern 3p, the condition is adjusted so that —$CR^1R^2R^3$ which the first monomer unit derived from the polymer X has at a terminal of a side chain is not cleaved. The metallization of the organic film pattern 3p formed in this manner is performed, for example, as follows.

A multilayer body having the target film 2 and the organic film pattern 3p on the semiconductor substrate 1 in such order is carried in a vacuum device, and the organic film pattern 3p is exposed to a gas or a liquid of the metal compound such as TMA as a metal-containing fluid. At this occasion, as represented in the above-described reaction formula (F), a molecule of the metal compound is absorbed to the carbonyl group of the first monomer unit which the polymer of the organic film pattern 3p is to cleave —$CR^1R^2R^3$. Then, for example, as represented in the monomer unit (1') in the reaction formula (F), the structure in which the metal compound ($Al(CH_3)_x$) is firmly bonded to two oxygen atoms of the organic film is formed.

In order to firmly bind the metal compound to the organic film pattern 3p as described above, exposure treatment of the metal compound to the organic film pattern 3p is preferably performed under heating. A heating temperature is appropriately selected according to the kind of the metal compound and the kind of the first monomer unit, particularly the kind of —$CR^1R^2R^3$. For example, when the metal compound is TMA, and C of —$CR^1R^2R^3$ of the first monomer unit is the tertiary carbon, setting a heating temperature of 50° C. or higher, preferably 100° C. or higher makes it easy that —$CR^1R^2R^3$ is cleaved, and allows TMA to be firmly bonded to the organic film.

Further, when the metal compound is TMA, and C of —$CR^1R^2R^3$ of the first monomer unit is the secondary carbon, setting a heating temperature of 80° C. or higher, preferably 100° C. or higher makes it easy that —$CR^1R^2R^3$ is cleaved, and allows TMA to be firmly bonded to the organic film. Moreover, when the metal compound is TMA, and C of —$CR^1R^2R^3$ of the first monomer unit is the primary carbon, setting a heating temperature of 100° C. or higher, preferably 120° C. or higher makes it easy that —$CR^1R^2R^3$ is cleaved, and allows TMA to be firmly bonded to the organic film. An upper limit of the heating temperature in this case is preferably set to 400° C. from the viewpoint of, for example, preventing the decomposition of a main chain of the polymer of the organic film pattern 3p.

As the metal compound, a metal compound to be used in a CVD method or an atomic layer deposition (ALD) method can be used particularly without limitation.

As metals each included in the metal compound, there can be cited aluminum, titanium, tungsten, vanadium, hafnium, zirconium, tantalum, molybdenum, and so on. Among organometal compounds or halides of these, the ones including a sufficiently small ligand are usable as the metal compound.

Specifically, the usable metal compound can include at least any one of $AlCl_3$, $TiCl_4$, $WCl_6$, $VCl_4$, $HfCl_4$, $ZrCl_4$, TMA, and the like. TMA is preferred in this embodiment.

According to the above, the polymer constituting the organic film pattern 3p is metallized to form the mask pattern 3m composed of the composite film of the organic film and the metal compound. Note that after bonding the metal compound in the organic film pattern 3p, the resultant may be subjected to oxidation treatment such as exposure in a water vapor atmosphere. For example, when TMA is used as the metal compound in the above, TMA becomes aluminum hydroxide or the like by the oxidation treatment. The oxidation treatment is performed normally by using an oxidant such as water, ozone, or oxygen plasma. Note that the oxidation treatment is sometimes performed naturally by water in an atmosphere without special operation.

Figure 1E:
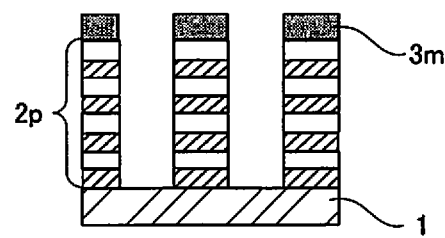
FIG. 1E is a view illustrating one process of the method of manufacturing the semiconductor device according to the embodiment.

Next, the target film 2 is etching-processed by RIE, IBE, or the like while using the mask pattern 3m as a mask as illustrated in FIG. 1E, to form the patterned target film 2p. This causes the patterned target film 2p provided with a processing shape having a high aspect ratio to be formed.

Thereafter, for example, a memory cell array is formed by using aknown method. For example, it is assumed that a hole pattern is formed on a layered film by the above-described process. It is possible to embed a block layer, a charge storage layer, a tunnel layer, a channel layer, and a core layer in such a hole, and form a memory structure. Thereafter, only the nitride films are removed in the layered film via slits formed in addition to the hole pattern including the memory structure, and conductive films are alternatively embedded. This causes a layered film in which the insulating films (oxide films) and the conductive films are alternately layered. The conductive films in the layered film can be made to function as word lines.

Since the pattern forming material contains the polymer having the first monomer unit represented by the general formula (1), to the organic film obtained by using this, the metal compound can be firmly bonded by the metallization. Then, the composite film obtained by the metallization has high etch resistance, particularly high IBE resistance. This makes it possible to obtain the mask pattern 3m having high etch resistance and makes it possible to impart a processing shape having a high aspect ratio with respect to the target film when the pattern forming material is used.

When the polymer which the pattern forming material contains is the crosslinkable polymer including the second monomer unit having a crosslinkable functional group at a terminal of a side chain in addition to the first monomer unit, crosslinking the polymers to each other in forming the organic film makes it possible that the obtained organic film becomes insoluble to the organic solvent. This allows an upper layer film such as the functional film or a precursor film thereof to be formed on the organic film by applying the wet coating solution, or the like. At this time, it is possible to suppress mixing of the organic film and the upper layer film or the precursor film thereof. As the upper layer film or the precursor film thereof, besides the above-mentioned SOG film, for example, there is a SOC (Spin On Carbon) film, a TEOS (tetraethyl orthosilicate) film, a resist film, or the like. By using the organic film obtained from the pattern forming material containing the crosslinkable polymer as the second monomer unit, flexibility of a design of the multilayer mask structure is dramatically increased.

According to the pattern forming material, the organic film can be formed by the method such as spin coating, dip coating, or vapor deposition. For example, the carbon deposited layer obtained by using the conventionally used CVD method requires a long time for film formation, while according to the pattern forming material, the organic film to become the composite film provided with high etch resistance can be formed simply in a short time. The method in which the organic film is formed into the composite film by the metallization is also a simple and economical method. Note that in a case of the wet coating method such as spin coating or dip coating, the composition of the embodiment can be used.

Note that in the above-mentioned embodiment, the example of metallizing the organic film pattern 3p mainly in a gas phase is given, but this is not restrictive. The organic film pattern 3p may be metallized in a liquid phase.

Further, in the above-mentioned embodiment, as the multilayer mask structure, mainly, the structure having the organic film 3, the silicon oxide film 4, and the resist pattern 5p is indicated, but this is not restrictive. As the multilayer mask structure, various configurations can be employed by inserting various films other than the above-described ones, or reducing some of the above-described films.

Further, in the above-mentioned embodiment, the mask pattern 3m is formed on the semiconductor substrate 1, but this is not restrictive. The mask pattern can be formed on the substrate of glass, quartz, mica, or the like besides the semiconductor substrate of silicon or the like.

EXAMPLES

The embodiment will be explained in further detail by using examples below, but the embodiment is not limited to these examples.

Examples 1 to 9

First, a crosslinkable polymer X constituted of only a first monomer unit and a second monomer unit was produced by the following method. A composition for pattern formation was prepared by using a pattern forming material containing the obtained polymer X and an organic solvent to be evaluated. Examples 1 to 8 are the examples of the embodiment and example 9 is the conventional example.

(Polymerization of Crosslinkable Polymer X)

Constituent monomers of the first monomer unit and constituent monomers of the second monomer unit presented in Table 2 were each used at amounts presented in Table 2, and each polymerized in the following process to obtain crosslinkable polymers X-1 to X-8. The yields of the obtained polymers X-1 to X-8 were about 80% to 90%. In addition, methyl methacrylate (indicated in Table 2 as "MMA") being the compound shown in the general formula (1), where $R^1$ to $R^3$ is hydrogen atoms, $R^5$ is a single bond and $R^4$ is methyl group, and the constitution monomer of the second monomer unit in Table 2 were each used at amounts presented in Table 2, and polymerized in the following process to synthesize polymer XR as the conventional example which was used for comparison.

In a 100 cc round-bottomed flask, the constituent monomers of the first monomer unit or MMA, the constituent monomers of the second monomer unit, and 0.01 mmol of azobisisobutyronitrile (AIBN) as a polymerization initiator were put, and about 5 mL of toluene was added as a polymerization solvent. After substitution of air in the flask to nitrogen, the monomers were polymerized for 8 hours at a temperature of 100° C. After the reaction, the flask was opened to the atmosphere to terminate the polymerization, and thereafter the reaction solutions were each dropped in a large excess of methanol to purify the polymer component by reprecipitation. The obtained solids were filtered off, and these solids were dried in a vacuum for several days to obtain desired polymers X.

TABLE 2

| Polymer number | First monomer unit | | Second monomer unit | |
|---|---|---|---|---|
| | Kind of monomer | Monomer amount [mmol] | Kind of monomer | Monomer amount [mmol] |
| X-1 | M-2 | 9.7 | L1-1M | 0.3 |
| X-2 | M-3 | 9.7 | L1-1M | 0.3 |
| X-3 | M-4 | 9.7 | L1-1M | 0.3 |
| X-4 | M-7 | 9.7 | L1-1M | 0.3 |
| X-5 | M-9 | 9.7 | L1-1M | 0.3 |
| X-6 | M-12 | 9.5 | L1-1M | 0.5 |
| X-7 | M-13 | 9.0 | L1-1M | 1 |
| X-8 | M-14 | 9.0 | L1-1M | 1 |
| XR | MMA | 9.7 | L1-1M | 0.3 |

(Preparation of Pattern Forming Material and Composition for Pattern Formation)

A citric acid (indicated in Table 3 as "CA") as a curing agent was added to each of the polymers X-1 to X-5 and polymer XR at a ratio of 0.5 mol to 1 mol of a glycidyl group in each of the polymers X and polymer XR, to form pattern forming materials 1 to 5 and 9 (Examples 1 to 5 and 9). Regarding polymers X-6 to X-8, a citric acid was not added to any of the polymers X to form pattern forming materials 6 to 8 (Examples 6 to 8). Moreover, regarding each of the obtained pattern forming materials 1 to 9, PGMEA was added so that the content of each of the pattern forming materials was 10 weight %, to prepare compositions for pattern formation.

[Evaluation]

The organic films were produced by using the compositions for pattern formation including the pattern forming materials 1 to 9, and a metallization process was performed by the following method to produce composite films. The metallization property of the organic films and the etch resistance of the obtained composite films were evaluated.

[Metallization Property]

The organic films were formed on Si substrates by using the pattern forming materials 1 to 9, and the organic films were each metallized by using TMA to evaluate the metallization property.

For Si substrates in each of which a Si substrate subjected to three minutes of UV curing was used. Each of above prepared compositions for pattern formation was applied on the Si substrate by spin coating. The number of rotations was adjusted in between 2000 to 3500 rpm according to the kind of polymer, and after the applying, the organic solvent was removed by drying to form the organic films each having a thickness of about 300 nm. Furthermore the organic films were annealed at 200° C. to promote the crosslinking reaction. The obtained, organic film-attached Si substrates were cut into 15 mm square to form samples for metallization process.

The metallization was performed by an atomic layer deposition (ALD) apparatus. Specifically, the metallization was performed by an exposure mode of placing the samples for metallization process in the ALD apparatus, introducing gas-phase TMA into the apparatus up to the predetermined pressure, and thereafter closing a valve to hold the pressure in the above state for the predetermined time. The initial pressure was set to 900 Pa, the retention time was set to 600 seconds and the temperature was set to 100° C. Note, the pressure in ALD apparatus gradually became higher over time because TMA was decomposed and methane was formed. TMA was coordinated to the lone electron pair which polymer X or polymer XR has in the organic thin film by this operation.

After the exposure by TMA, the gas phase in the apparatus was substituted to water vapor ($H_2O$), the pressure was increased to a predetermined pressure, and the valve was closed to retain the pressure in that state for a predetermined time. The initial pressure was set to 300 Pa, and the retention time was set to 200 seconds. The temperature was the same as that of TMA. The pressure in the apparatus became gradually low because $H_2O$ was consumed. After the retention time under the state where $H_2O$ was filled was elapsed, the metallized samples for metallization were taken out of the apparatus. TMA was oxidized to be aluminum hydroxide or aluminum oxide by this operation.

Here, the ALD apparatus is used for the above-described metallization process, but the above-described operation is aimed on infiltration of TMA into the polymer, and is not aimed on depositing an atomic layer on the substrate, what is called atomic layer deposition (ALD). Therefore, an exposure time to the metal compound is longer, and the number of cycles is smaller than that of normal ALD process.

In a degree of the metallization, an Al amount [atom %] per unit volume of the metallized organic film, measured by XPS, was set as an index. Table 3 presents the result. The Al amounts presented in Table 3 were each presented while having a range because a composition ratio detected in a depth direction has some fluctuation regarding measurement characteristics of the XPS.

(Etch Resistance)

Each substrate with the organic film (each substrate with the composite film) which was metallized was subjected to reactive ion etching (RIE) using $O_2$ gas or $CF_4$ gas. Film thicknesses of the composite film of each substrate with the composite film were measured by using the atomic force microscope (AFM) before and after the RIE, and an etching rate [nm/sec] was calculated using a difference between the film thicknesses before and after the RIE as an etching amount and an etching time. Results are listed in Table 3. In Table 3 "as spun" indicates the etching rate of the organic film before metallization "metallized" indicates the etching rate of the metallized organic film.

(1) $O_2$RIE $O_2$RIE was performed by using CI-300L (manufactured by Samco Inc.), under conditions of power: 50 W, bias 5 W, flow: 5 sccm, pressure: 3 Pa.

(2) $CF_4$RIE $CF_4$RIE was performed by using CI-300L, under conditions of power: 50 W, bias 10W, flow: 5 sccm, pressure: 3 Pa.

The etch resistance for the $O_2$RIE dramatically improves as the degree of metallization increases. The etch resistance for the $O_2$RIE of the composite film using the pattern forming material including the polymer having ester bond (—C(=O)—O) at side chain is high. It is thought that the etch resistance for the $O_2$RIE become higher, because a component has many carbonyl groups, where it is easily metallized. Further, the etch resistance for the $CF_4$RIE improves as the degree of metallization increases.

(3) IBE

Each of the organic film-attached substrates metallized in the above description (each of the composite film-attached substrates) was performed by ion beam etching (IBE). A film thickness of the composite film of each of the composite film-attached substrates was measured before and after the IBE by using an atomic force microscope (AFM), and a film thickness difference before and after the IBE was regarded as an etching amount to calculate an etching rate [nm/sec].

(4) Etch resistance for the $O_2$RIE assumed memory hall
Assume the condition that is near to RIE of the memory hall of the three-dimensional memory. The RIE was performed by using a mixed gas consists of $C_4F_6$ of 80 sccm, Ar of 100 sccm, $O_2$ of 54 sccm, and $N_2$ of 50 sccm. A film thickness difference before and after the etching was regarded as an etching amount to calculate an etching rate [nm/sec].

X-10 and polymer X-11 includes t-butyl methacrylate and t-butyl-4-vinyl benzoic acid respectively, in the first monomer unit at the same ratio to the first monomer unit each, and the others are the same composition in polymer X-10 and polymer X-11.

Further, polymers X-12 to X-22 were made so that more aromatic rings were included in pattern forming materials and metals are coordinated to carbonyl groups like the monomer unit (1') in the reaction formula (F). First, polymers X-12 to X-15 shown in the following Table 4 were produced, using styrene (indicated in Table 4 as "St"), 1-vinylnaphthalene (indicated in Table 4 as "1-VN"), 2-vi-

TABLE 3

| Example | Kind of polymer | pattern forming material curing agent | Al amount (atom %) | $O_2$ RIE rate (nm/sec) as spun | $O_2$ RIE rate (nm/sec) metallized | $CF_4$ RIE rate (nm/sec) as spun | $CF_4$ RIE rate (nm/sec) metallized | Mixed Gas RIE rate (nm/sec) as spun | Mixed Gas RIE rate (nm/sec) metallized | IBE rate (nm/sec) as spun | IBE rate (nm/sec) metallized |
|---|---|---|---|---|---|---|---|---|---|---|---|
| 1 | X-1 | CA | 23 | 0.45 | 0.033 | 1.5 | 0.221 | 0.89 | 0.36 | 1.5 | 1.1 |
| 2 | X-2 | CA | 22 | 0.44 | 0.032 | 1.3 | 0.203 | 0.78 | 0.36 | 1.4 | 1.0 |
| 3 | X-3 | CA | 21 | 0.44 | 0.029 | 1.3 | 0.198 | 0.83 | 0.42 | 1.4 | 1.0 |
| 4 | X-4 | CA | 27 | 0.43 | 0.025 | 1.3 | 0.223 | 0.92 | 0.38 | 1.4 | 1.1 |
| 5 | X-5 | CA | 24 | 0.44 | 0.032 | 1.2 | 0.256 | 0.87 | 0.42 | 1.4 | 1.0 |
| 6 | X-6 | — | 14 | 0.23 | 0.036 | 0.61 | 0.36 | 0.65 | 0.042 | 0.91 | 0.78 |
| 7 | X-7 | — | 15 | 0.21 | 0.021 | 0.57 | 0.26 | 0.83 | 0.24 | 0.83 | 0.54 |
| 8 | X-8 | — | 15 | 0.24 | 0.04 | 0.56 | 0.24 | 0.62 | 0.055 | 0.83 | 0.5 |
| 9 | XR | CA | 23 | 0.35 | 0.061 | 0.94 | 0.393 | 0.64 | 0.48 | 1.4 | 1.6 |

As presented in Table 3, it is found that the composite film formed by using the pattern forming material has higher etch resistance than the example 9 being the conventional example. In addition, it is found that the resistances to each etching of the composite films formed using the pattern forming materials of example 6 to 8 including polymer X-6 to X-8 including the aromatic ring were higher than the composite films formed using the pattern forming materials of example 1 to 5 including polymer X-1 to X-5 which did not include an aromatic ring.

Examples 10 to 22

Polymers X-10 to X-22 shown in the following Table 4 were made to confirm that it would raise the etch resistance by increasing the content of aromatic rings in the polymer X and evaluated each etch resistance of the pattern forming materials of example 10 to 22 (the examples of the embodiment) which included these polymers.

Specifically, each etch resistance of the pattern forming material including polymer X-10 and the pattern forming material including polymer X-11 were evaluated. Polymer nylnaphthalene (indicated in Table 4 as "2-VN"), and 9-vinylanthracene (indicated in Table 4 as "9-VA") as the different monomer unit having an aromatic ring respectively, and evaluated each etch resistance of the pattern forming materials including theses polymers.

Furthermore, polymers X-16 to X-22 shown in the following Table 4 were produced, using two kinds of the first monomer unit having an aromatic ring respectively and one kind of the second monomer unit, and evaluated each etch resistance of the pattern forming materials including theses polymers.

(Polymerization of Polymer X-10 to X-22)

The constituent monomers of the first monomer unit, the constituent monomers of the different monomer unit, and the constituent monomers of the second monomer unit presented in Table 4 were each used at amounts presented in Table 4, and each were polymerized in the same manner as the process of the polymerization of the polymers X-1 to X-8, to obtain crosslinkable polymers X-10 to X-22. The yields of the obtained polymers X-10 to X-22 were approximately 80% to 90%.

TABLE 4

| Polymer number | First monomer unit Kind of monomer | First monomer unit Monomer amount [mmol] | Different monomer unit Kind of monomer | Different monomer unit Monomer amount [mmol] | Different monomer unit Kind of monomer | Different monomer unit Monomer amount [mmol] | Second monomer unit Kind of monomer | Second monomer unit Monomer amount [mmol] |
|---|---|---|---|---|---|---|---|---|
| X-10 | M-2 | 4.9 | M-25 | 4.9 | — | — | L1-1M | 0.2 |
| X-11 | M-12 | 4.9 | M-25 | 4.9 | — | — | L1-1M | 0.2 |
| X-12 | M-12 | 4.9 | — | — | St | 4.9 | L1-1M | 0.2 |
| X-13 | M-12 | 4.9 | — | — | 1-VN | 4.9 | L1-1M | 0.2 |
| X-14 | M-12 | 4.9 | — | — | 2-VN | 4.9 | L1-1M | 0.2 |
| X-15 | M-12 | 4.9 | — | — | 9-VA | 4.9 | L1-1M | 0.2 |
| X-16 | M-12 | 4.9 | M-16 | 4.9 | | | L1-1M | 0.2 |

TABLE 4-continued

|  | First monomer unit | | | Different monomer unit | | Second monomer unit | |
|---|---|---|---|---|---|---|---|
| Polymer number | Kind of monomer | Monomer amount [mmol] | Kind of monomer | Monomer amount [mmol] | Kind of monomer | Monomer amount [mmol] | Kind of monomer | Monomer amount [mmol] |
| X-17 | M-12 | 4.9 | M-17 | 4.9 | | | L1-1M | 0.2 |
| X-18 | M-12 | 4.9 | M-22 | 4.9 | | | L1-1M | 0.2 |
| X-19 | M-12 | 4.9 | M-19 | 4.9 | | | L1-1M | 0.2 |
| X-20 | M-12 | 4.9 | M-21 | 4.9 | | | L1-1M | 0.2 |
| X-21 | M-13 | 9.0 | M-12 | 0.5 | | | L1-1M | 0.5 |
| X-22 | M-13 | 4.9 | M-12 | 4.9 | | | L1-1M | 0.2 |

(Preparation of Pattern Forming Material and Composition for Pattern Formation)

Regarding polymers X-10 to X-22, the curing agent was not added to any of the polymers X to form pattern forming materials 10 to 22 (Examples 10 to 22). Moreover, regarding each of the obtained pattern forming materials 10 to 22, PGMEA was added so that the content of each of the pattern forming materials was 10 weight %, to prepare compositions for pattern formation.

[Evaluation]

The organic films were produced by using the compositions for pattern formation including the pattern forming materials 10 to 22, and the metallization process were conducted by the method like the examples 1 to 9 to produce composite films. The metallization property of the organic films and the etch resistance of the obtained composite films were evaluated. Results are listed in Table 5.

was near to RIE process to form memory hall of the three-dimensional memory, the etch resistances were higher than a conventional one.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

TABLE 5

| Example | Kind of polymer | Al amount (atom %) | $O_2$ RIE rate (nm/sec) | | $CF_4$ RIE rate (nm/sec) | | Mixed Gas RIE rate (nm/sec) | | IBE rate (nm/sec) | |
|---|---|---|---|---|---|---|---|---|---|---|
| | | | as spun | metallized | as spun | metallized | as spun | metallized | as spun | metallized |
| 10 | X-10 | 29 | 0.44 | 0 | 0.56 | 0.383 | 0.64 | 0.13 | 1.1 | 1.1 |
| 11 | X-11 | 26 | 0.24 | 0 | 0.34 | 0.216 | 0.44 | 0.022 | 0.7 | 0.95 |
| 12 | X-12 | 12 | 0.2 | 0.03 | 0.28 | 0.18 | 0.36 | 0.022 | 0.67 | 0.59 |
| 13 | X-13 | 10 | 0.17 | 0.02 | 0.23 | 0.153 | 0.29 | 0.018 | 0.58 | 0.49 |
| 14 | X-14 | 10 | 0.17 | 0.024 | 0.24 | 0.153 | 0.31 | 0.018 | 0.6 | 0.47 |
| 15 | X-15 | 9 | 0.16 | 0.025 | 0.22 | 0.144 | 0.28 | 0.017 | 0.55 | 0.52 |
| 16 | X-16 | 16 | 0.26 | 0.016 | 0.36 | 0.234 | 0.47 | 0.028 | 0.82 | 0.94 |
| 17 | X-17 | 18 | 0.25 | 0.015 | 0.35 | 0.225 | 0.46 | 0.027 | 0.65 | 1.0 |
| 18 | X-18 | 16 | 0.27 | 0.018 | 0.38 | 0.243 | 0.49 | 0.029 | 0.71 | 1.1 |
| 19 | X-19 | 21 | 0.22 | 0.011 | 0.31 | 0.198 | 0.4 | 0.024 | 0.65 | 1.0 |
| 20 | X-20 | 20 | 0.22 | 0.012 | 0.3 | 0.198 | 0.39 | 0.023 | 0.57 | 1.0 |
| 21 | X-21 | 14 | 0.22 | 0.021 | 0.62 | 0.24 | 0.68 | 0.031 | 0.83 | 0.51 |
| 22 | X-22 | 14 | 0.22 | 0.025 | 0.59 | 0.27 | 0.76 | 0.048 | 0.91 | 0.73 |

As presented in Table 5, it is found that the composite film formed by applying the pattern forming material of Example 11 including the polymer X-11 has higher etch resistance than the composite film formed by the pattern forming material of Example 10 including the polymer X-10. Namely it was confirmed that the pattern formation material having more aromatic rings is high in etch resistance. In addition, it was confirmed that the composite films formed by applying the pattern forming material of Examples 12 to 22 similarly have high etch resistance.

As presented in Table 3 and Table 5, it is found that the composite film formed by using the pattern forming material of the embodiment has high etch resistance. Especially it was confirmed that, regarding all of the composite films obtained by the etching condition with the mixed gas which

What is claimed is:

1. A pattern forming material comprising:

a polymer including a first monomer unit represented by a following general formula (1), the pattern forming material being used for manufacturing a composite film as a mask pattern for processing a target film on a substrate, the composite film being formed by a process including, forming an organic film on the target film with the pattern forming material, patterning the organic film, and forming the composite film by infiltering a metal compound into the patterned organic film after patterning the organic film,

[Chemical formula 1]

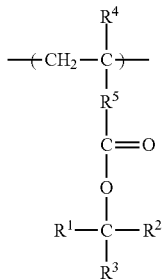

(1)

wherein, R1, R2 and R3 each independently represent a hydrogen atom or a hydrocarbon group which may have an oxygen atom, at least one of R1, R2 and R3 is a hydrocarbon group, a total number of carbon atoms of R1, R2 and R3 is 1 to 13, and R1, R2 and R3 may be bonded to each other to form a ring, R4 is a hydrogen atom or a methyl group, and R5 is a single bond, or a hydrocarbon group which has 1 to 20 carbon atoms and may have an oxygen atom, a nitrogen atom, or a sulfur atom between carbon-carbon atoms or at a bond terminal, and a hydrogen atom thereof may be substituted by a halogen atom.

2. The pattern forming material according to claim 1, wherein one or two of R1, R2 and R3 are hydrogen atoms in the general formula (1).

3. The pattern forming material according to claim 1, wherein R5 in the general formula (1) contains an aromatic ring.

4. The pattern forming material according to claim 1, wherein a molar ratio of the first monomer unit to all monomer units in the polymer is 50 mol % or more.

5. The pattern forming material according to claim 1, wherein the polymer further includes a second monomer unit having a crosslinkable functional group at a terminal of a side chain.

6. The pattern forming material according to claim 5, wherein a molar ratio of the second monomer unit to all monomer units in the polymer is 0.5 mol % or more and less than 20 mol %.

7. The pattern forming material according to claim 5, further containing a curing agent having reactivity with the crosslinkable functional group.

8. A composition for pattern formation containing the pattern forming material according to claim 1 and an organic solvent capable of dissolving the pattern forming material.

9. The pattern forming material according to claim 1, wherein the polymer includes a linear polymer.

10. A pattern forming method comprising:
forming an organic film on a substrate with a pattern forming material;
patterning the organic film; and
forming a composite film by infiltering a metal compound into the patterned organic film after patterning the organic film to obtain a mask pattern composed of the composite film, wherein
the pattern forming material contains a polymer including a first monomer unit represented by a following general formula (1),

[Chemical formula 2]

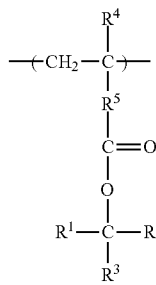

(1)

wherein, R1, R2 and R3 each independently represent a hydrogen atom or a hydrocarbon group which may have an oxygen atom, at least one of R1, R2 and R3 is a hydrocarbon group, a total number of carbon atoms of R1, R2 and R3 is 1 to 13, and R1, R2 and R3 may be bonded to each other to form a ring, R4 is a hydrogen atom or a methyl group, and R5 is a single bond, or a hydrocarbon group which has 1 to 20 carbon atoms and may have an oxygen atom, a nitrogen atom, or a sulfur atom between carbon-carbon atoms or at a bond terminal, and a hydrogen atom thereof may be substituted by a halogen atom.

11. The method according to claim 10, wherein one or two of R1, R2 and R3 are hydrogen atoms in the general formula (1).

12. The method according to claim 10, wherein R5 in the general formula (1) contains an aromatic ring.

13. The method according to claim 10, wherein a molar ratio of the first monomer unit to all monomer units in the polymer is 50 mol % or more.

14. The method according to claim 10, wherein the polymer further includes a second monomer unit having a crosslinkable functional group at a terminal of a side chain.

15. The method according to claim 14, wherein a molar ratio of the second monomer unit to all monomer units in the polymer is 0.5 mol % or more and less than 20 mol %.

16. The method according to claim 14, wherein the pattern forming material further contains a curing agent having reactivity with the crosslinkable functional group.

17. The method according to claim 10, wherein the polymer includes a linear polymer.

18. A method of manufacturing a semiconductor device, comprising:
forming an organic film on a target film on a semiconductor substrate with a pattern forming material;
patterning the organic film,
forming a mask pattern composed of a composite film by infiltering a metal compound into the patterned organic film after patterning the organic film; and
processing the target film by using the mask pattern, wherein
the pattern forming material contains a polymer including a first monomer unit represented by a following general formula (1),

[Chemical formula 3]

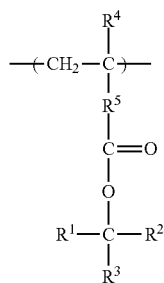

(1)

wherein, R1, R2 and R3 each independently represent a hydrogen atom or a hydrocarbon group which may have an oxygen atom, at least one of R1, R2 and R3 is a hydrocarbon group, a total number of carbon atoms of R1, R2 and R3 is 1 to 13, and R1, R2 and R3 may be bonded to each other to form a ring, R4 is a hydrogen atom or a methyl group, and R5 is a single bond, or a hydrocarbon group which has 1 to 20 carbon atoms and may have an oxygen atom, a nitrogen atom, or a sulfur atom between carbon-carbon atoms or at a bond terminal, and a hydrogen atom thereof may be substituted by a halogen atom.

19. The method according to claim 18, wherein one or two of R1, R2 and R3 are hydrogen atoms in the general formula (1).

20. The method according to claim 18, wherein R5 in the general formula (1) contains an aromatic ring.

21. The method according to claim 18, wherein the polymer further includes a second monomer unit having a crosslinkable functional group at a terminal of a side chain.

22. The method according to claim 21, wherein the pattern forming material further contains a curing agent having reactivity with the crosslinkable functional group.

23. The method according to claim 18, wherein the polymer includes a linear polymer.

\* \* \* \* \*